(12) United States Patent
Carter

(10) Patent No.: US 7,563,646 B2
(45) Date of Patent: Jul. 21, 2009

(54) MOLDED CERAMIC SURFACE MOUNT PACKAGE

(75) Inventor: Jerry L. Carter, Pomona, CA (US)

(73) Assignee: StratEdge Corporation, San Diego, CA (US)

( * ) Notice: Subject to any disclaimer, the term of this patent is extended or adjusted under 35 U.S.C. 154(b) by 70 days.

(21) Appl. No.: 11/756,550

(22) Filed: May 31, 2007

(65) Prior Publication Data

US 2008/0296753 A1      Dec. 4, 2008

(51) Int. Cl.
    *H01L 21/00*      (2006.01)
(52) U.S. Cl. ............................. 438/118; 438/125
(58) Field of Classification Search ............. 257/704, 257/710; 438/116, 118, 125
    See application file for complete search history.

(56) References Cited

U.S. PATENT DOCUMENTS

| 5,616,954 | A | 4/1997 | Tobase |
| 6,639,305 | B2 | 10/2003 | Carter et al. |
| 6,844,606 | B2* | 1/2005 | Logsdon et al. ............. 257/434 |
| 6,924,549 | B2 | 8/2005 | Nose et al. |
| 6,969,639 | B2* | 11/2005 | Cho et al. ................ 438/118 |
| 2004/0121516 | A1 | 6/2004 | Yamazaki et al. |
| 2004/0223373 | A1 | 11/2004 | DiCamp et al. |
| 2005/0167795 | A1* | 8/2005 | Higashi ..................... 257/678 |
| 2006/0197215 | A1* | 9/2006 | Potter ....................... 257/704 |
| 2008/0099908 | A1* | 5/2008 | Wang et al. ................ 257/704 |

FOREIGN PATENT DOCUMENTS

EP     0275973  B1     10/1993

* cited by examiner

*Primary Examiner*—S. V Clark
(74) *Attorney, Agent, or Firm*—Procopio, Cory, Hargreaves & Savitch, LLP

(57) ABSTRACT

The surface mount package is assembled from a ceramic base which is imprinted on its upper and lower surfaces with conductive patterns for attachment of and connection to an electronic or electromechanical device, a molded dielectric layer for forming a cavity and a seal ring. The molded dielectric is formed by aligning a dielectric preform with the base, positioning the seal ring on top of the preform, then applying a mold over the layers to shape the dielectric during a firing process that fuses the base, preform and seal ring to create a hermetic seal. The preform is of sufficient thickness that the electronic device will be fully contained within the cavity when placed into the completed package.

20 Claims, 5 Drawing Sheets

MOLDED CERAMIC SURFACE MOUNT PACKAGE

FIELD OF THE INVENTION

The present invention relates to a method for manufacturing microelectronics packages and, more specifically, to a hermetically-sealed surface mount package that is suitably sized for replacing quad flat packages.

BACKGROUND OF THE INVENTION

State of the art technologies such as mobile telephones, laptop and notebook computers, and hand-held communication devices, among others, have been improved and made more user-friendly in terms of weight and cost reductions by advances in microelectronic circuit design and materials that provide faster computing speeds with lower power demands. Product performance requirements spiral from the effects of increasing operating speed, decreasing package size, lowering cost, and reducing time to market. These spiraling requirements raise new component packaging and handling issues in which the circuit advances must be complemented by circuit packaging to take full advantage of the technology improvements. Packaging must protect the chip against adverse environmental conditions and dissipate the tremendous amount of heat produced, yet maintaining the electrical integrity.

Quad flat packages (QFPs) are surface mount packages that have been developed to implement the miniaturization and advanced functions of various kinds of electronic devices. QFPs come in a number of different forms including packages with leads extending out from all the four sides of the package body and package without leads, known as QFNs (quad flat package—no leads). A QFP in particular facilitates impedance matching because it has a substantially square contour, i.e., all wiring in the package has substantially the same length. For this reason, QFPs are extensively applied to, among others, logic circuits needing high-speed performance.

Most QFNs and QFPs are plastic and are not hermetic. The plastic is typically molded around the circuit, so there is no cavity. Hermeticity is desirable to prolong circuit life. Cavities are needed with certain types of circuits because their components cannot tolerate physical contact with the package material. This is particularly true for MEMS (Micro ElectroMechanical System) devices, which include electrical and mechanical components integrated on the same substrate, for example, a silicon substrate. Further, in addition to the fact that plastic packages incorporate materials that are not permitted by military specifications, plastic packages usually do not meet the military leak rate specifications of $1\times10^{-7}$ standard cubic centimeters of helium gas per second. There are known methods for forming ceramic QFNs and QFPs from multi-layered co-fired ceramic, however, the start-up costs of a fabrication facility can be prohibitive. In particular, co-fire methods have been developed using BeO and AlN, however, they have not been widely adopted because the ceramic material must be high purity, and high purity ceramics are not readily sintered in a multi-layer process such that very high process temperatures are required.

U.S. Pat. No. 5,616,954 describes a flat package for semiconductor integrated circuits that includes a cavity and is hermetically sealed. This package provides versatility in accommodating different chips, relieves the need to use leads for circuit ground and improves electrical shielding. The process for fabricating this package utilizes a multi-layer, multi-step approach.

A single layer surface mount package is disclosed in U.S. Pat. No. 6,639,305, on which the present inventor is named as a co-inventor. This SLSMP provides a number of advantages over the prior art, but the use of a lead frame makes it difficult to achieve the miniaturization required in many QFP applications. Further, the alloy base has relatively poor thermal conductivity and therefore may not provide the most efficient thermal performance.

The need remains for a small surface mount package that is formed from ceramic for hermeticity to provide high reliability while conforming to the dimensional requirements of conventional QFPs, and further that is economical to manufacture.

BRIEF SUMMARY OF THE INVENTION

It is an advantage of the present invention to provide a small hermetic surface mount package that may be used in applications requiring high reliability.

Another advantage of the present invention is to provide a molded ceramic package that meets the dimensional requirements of conventional QFPs that also includes the interior cavity that is preferred for many types of circuits.

It is yet another advantage of the invention to provide an economical method for manufacturing a surface mount package that avoids the use of multi-layer construction.

In one aspect of the invention, the surface mount package is assembled from a ceramic base that has conductive patterns for attachment of and connection to an electronic or electromechanical device disposed within the package plus input/output conductors for providing external connections, a molded dielectric layer for forming a cavity for holding the electronic device, and a seal ring. The molded dielectric structure is formed by aligning a dielectric preform with the base, positioning the seal ring on top of the preform, then applying a mold over the layers to shape the dielectric during a firing process that fuses the base, preform and seal ring to create a hermetic seal. The preform is of sufficient thickness that the electronic device will be fully contained within the cavity when placed into the completed package.

In an exemplary embodiment, a surface mount package suitable for micro-electronic devices is assembled from a ceramic base imprinted on its upper and lower surfaces with conductive patterns for attachment of and connection to an electronic or electromechanical device, a preformed dielectric layer for forming a cavity, a seal ring, and a lid. The conductive patterns, typically formed from a refractory metal, include a ground pad on which an electronic device is affixed inside the package to the top surface of the ceramic base and bond pads for bonding wires to attach the device to the base by standard wire bonding techniques known in the industry. The bottom surface of the ceramic base is imprinted with conductive patterns that are used to attach the package to the bond pads of a printed circuit board, to a corresponding socket, or to other electronic assembly. Vias through the base are metallized to provide input/output connections.

The cavity is defined by the combination of a dielectric (glass) preform in the shape of a rectangular frame and a seal ring that is placed on top of the preform. The preform is of sufficient thickness that the electronic device will be fully contained within the cavity when placed into the completed package. The seal ring may be made of metal, ceramic, plastic or any other suitable material. The seal ring has a shape generally matching that of the preform but has a wall width less than that of the preform so that its inner and outer surfaces are slightly recessed from the edges of the preform.

The package is formed by combining into a stack the ceramic base, the preform, and the seal ring. The preform and seal ring are stacked on top of the base which may be part of an array of unseparated bases or which may be placed as an individual pieces into a mold. The mold aligns the preform on top of the base, then centers the seal ring on top of the preform. The mold holds the ceramic base, the preform, and seal ring in alignment during heat processing of the package.

The mold, or mold and array combination, is placed into a furnace and processed under conditions, i.e., temperature, time and atmosphere, appropriate for the types of materials used. In an alternative embodiment, the mold may be resistively heated rather than placing it in a furnace. The mold may be configured for creating one package or may be designed to create several packages in an array of mold cavities, limited only by the size, weight, heating ability, and heating uniformity of the mold.

The heating of the mold causes the preform to fuse to the ceramic base and the seal ring to produce a hermetically sealed package once a lid is properly attached to the top of the seal ring. The preform defines a cavity that will retain the device(s) without contacting the sides or top of the device. If the base was part of an array, the array will be cut to separate the individual packages. Additional processing may include cleaning and plating of the base metallization with nickel and then gold, before or after the parts are separated. For assembly of a device in a package, the electronic device is attached to the attachment pad and connections are formed between the device to the conductive patterns on the ceramic base using known wirebond methods. A lid, made out of metal, ceramic or plastic, may then be soldered or otherwise attached after insertion and connection of the electronic device to produce a fully hermetically sealed package.

BRIEF DESCRIPTION OF THE DRAWINGS

The present invention will be more clearly understood from the following detailed description of the preferred embodiments of the invention and from the attached drawings, in which:

FIG. 2b is a cross sectional view of the package taken along line A-A of FIG. 2a.

DETAILED DESCRIPTION OF THE PREFERRED EMBODIMENTS

Figure 1:
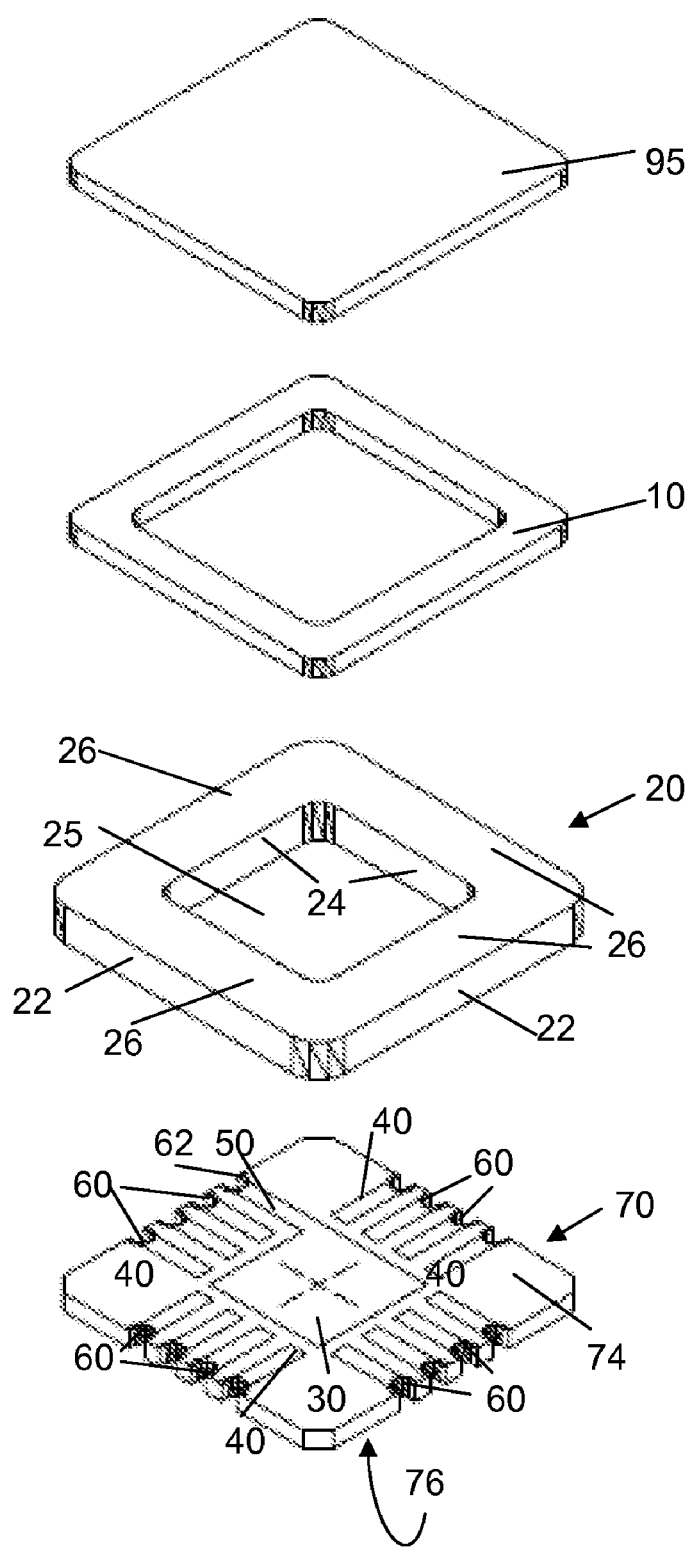
FIG. 1 is an exploded perspective view of a package according to the present invention.
Figure 2A:
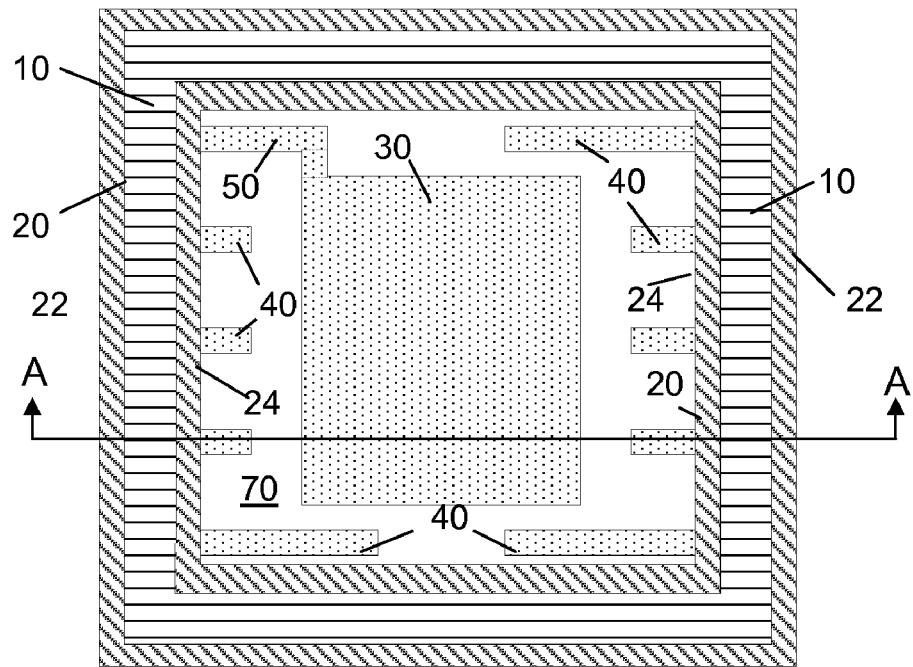
FIG. 2a is a top view of the package.
Figure 2B:
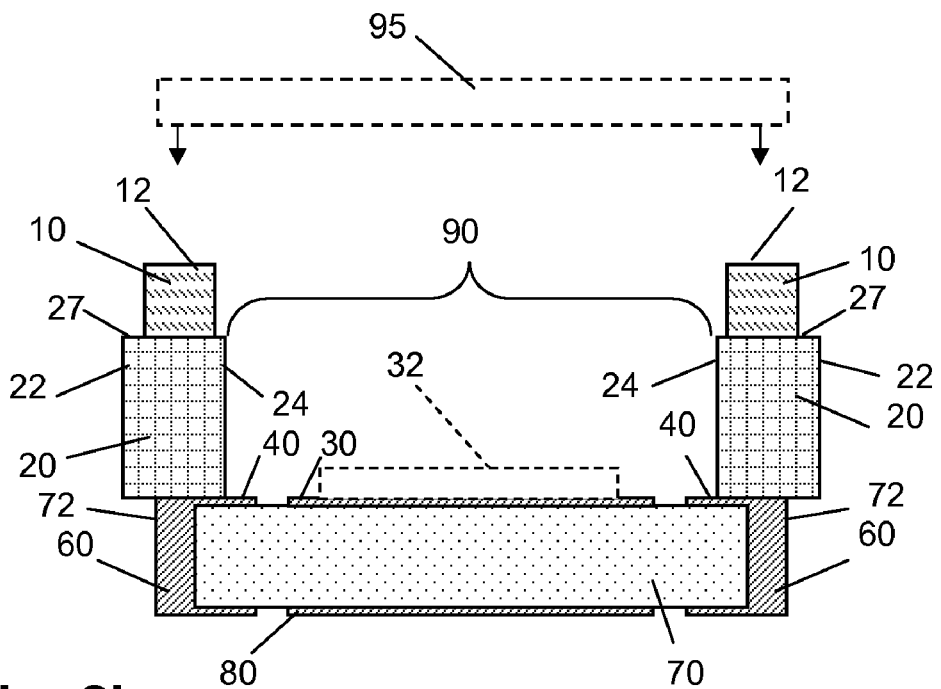

The basic components of the inventive package, illustrated in FIGS. 1, 2a and 2b, include a ceramic base 70, a glass preform 20, and a seal ring 10. The ceramic base 70 is formed by standard processing methods known in the industry by imprinting the desired conductive pattern(s) on the ceramic surface(s) using a commercially-available refractory metal paste, then curing and drying the paste in accordance with the paste manufacturer's recommendations.

Figure 3:
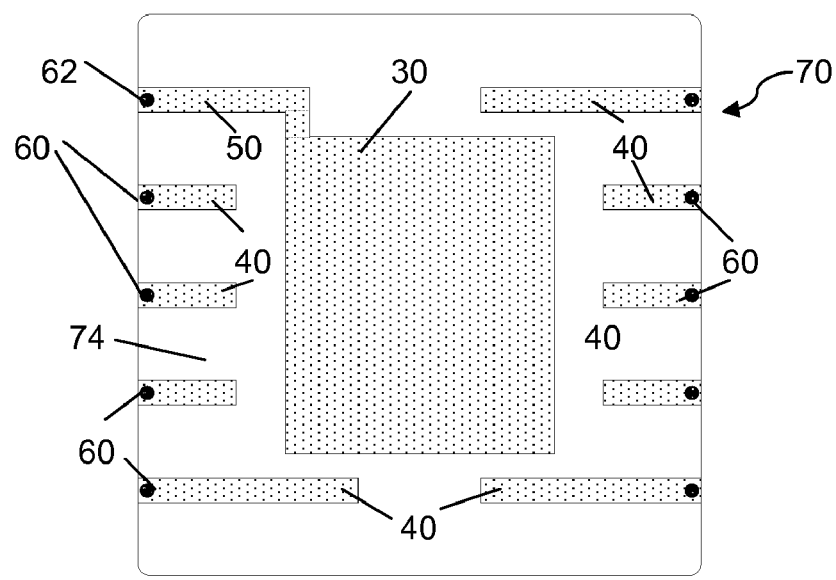
FIG. 3 is a top view of the ceramic base.
Figure 4:
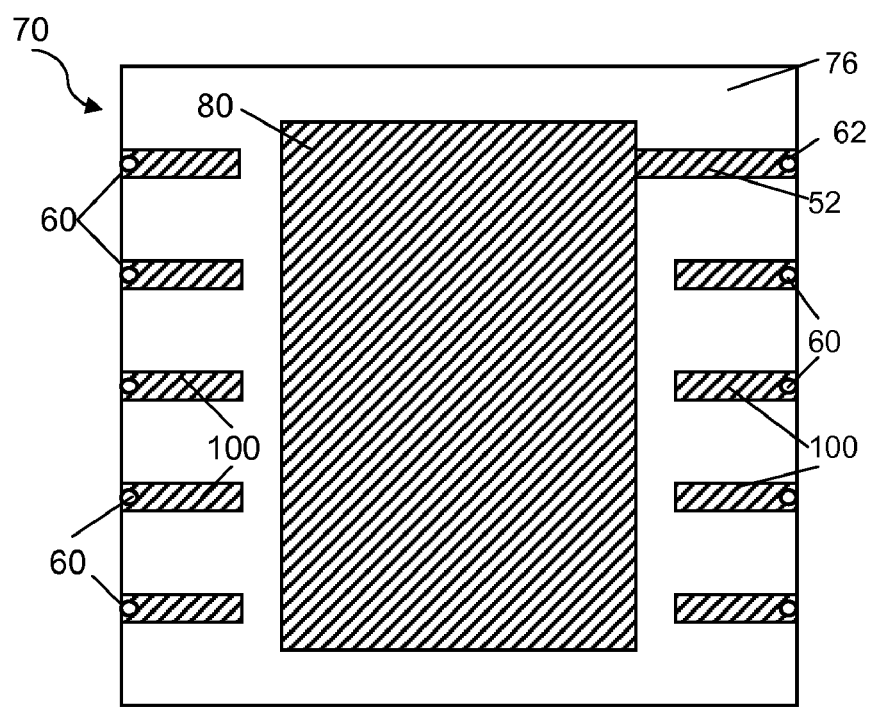
FIG. 4 is a bottom view of the ceramic base.

In the exemplary embodiment, base 70 is a metallized planar ceramic, which may be fabricated individually or as an array. Illustrated in FIG. 3, the conductive patterns on the upper surface 74 of base 70 define an attachment pad 30, wire bond pads 40, and a ground connector 50 that is connected to the mounting pad 30 and is used to ground the substrate of the electronic device (not shown). Vias 60 are machined into the base using a laser or other appropriate means to extend through the full thickness of the base to provide electrical connection into and out of the package. The vias 60 are coated with conductive material to electrically connect bond pads 40 to external pads 100 formed on the bottom surface 76 of base 70. Via 62 connects internal ground line 50 to external ground line 52 and to external ground pad 80.

The glass preform 20 is preferably formed from a glass, such as filled borosilicate glass, which is widely used in electronics package fabrication. A typical glass filled composition is Corning formulation 7052, commercially available from Corning (Corning, N.Y.) or its distributors, or an equivalent glass, filled with 20% by weight of fine aluminum oxide powder. Other dielectric materials may also be utilized to form the single preform layer. Acceptable materials for this purpose will be readily apparent to those in the art upon review of the teachings of the present invention.

The preform 20 is rectangular and frame-like in shape, with an opening at its center. To provide the impedance matching of a typical QFP, the shape will generally be square, however the inventive process is not intended to be limited to fabrication of square packages. The widths of the sidewalls 26 of preform 20 are such that the outer edge 22 will extend beyond the outer edge 72 of the ceramic base 70, as shown in FIG. 2b. The thickness of preform 20 is selected to define a cavity 90 with a depth that is greater than the thickness of any electronic device 32, including any MEMS device, that may be affixed within the package, so that there will be no contact with the upper surfaces of the device once the package is sealed. The inner edge 24 of the preform 20 extends onto the ceramic base 70 to create a sufficient bonding surface between the preform 20 and the ceramic base 70 to form a good hermetic seal. The sidewall width of preform 20 is selected so that it does not fully cover the bonding pads 40 or ground pad 50 so that the appropriate wire bonds can be formed to connect the electronic device 32 to the bond pads for input/output.

Seal ring 10 may be formed from a dielectric material, such as ceramic, or a conductive material, typically a metal alloy. In the preferred embodiment, ASTM F-15 alloy (Kovar®) is used. ASTM F-15, which is an alloy consisting of 53.7% iron, 29% nickel, 17% cobalt, 0.2% silicon, 0.05% manganese, and 0.06% carbon, is commercially available from numerous sources. Other alloys or non-conductive materials may be used and will preferably be selected to match the coefficient of thermal expansion of the dielectric material of the package. Prior to assembly, the metal seal ring used in a glass-to-metal sealed package may be cleaned and outgassed, then heated in air to oxidize its surface to enhances the adhesion characteristics.

The seal ring may also be cleaned of any residual oxide and electroplated first with nickel for adhesion and hardness properties, and then with gold. The nickel/gold finish provides good corrosion resistance and is readily wire bondable using gold wire. The finish plating should be compatible with the type of wire, e.g., gold, copper or aluminum, that will be employed for connection of the MMIC or other electronic device.

Figure 5:
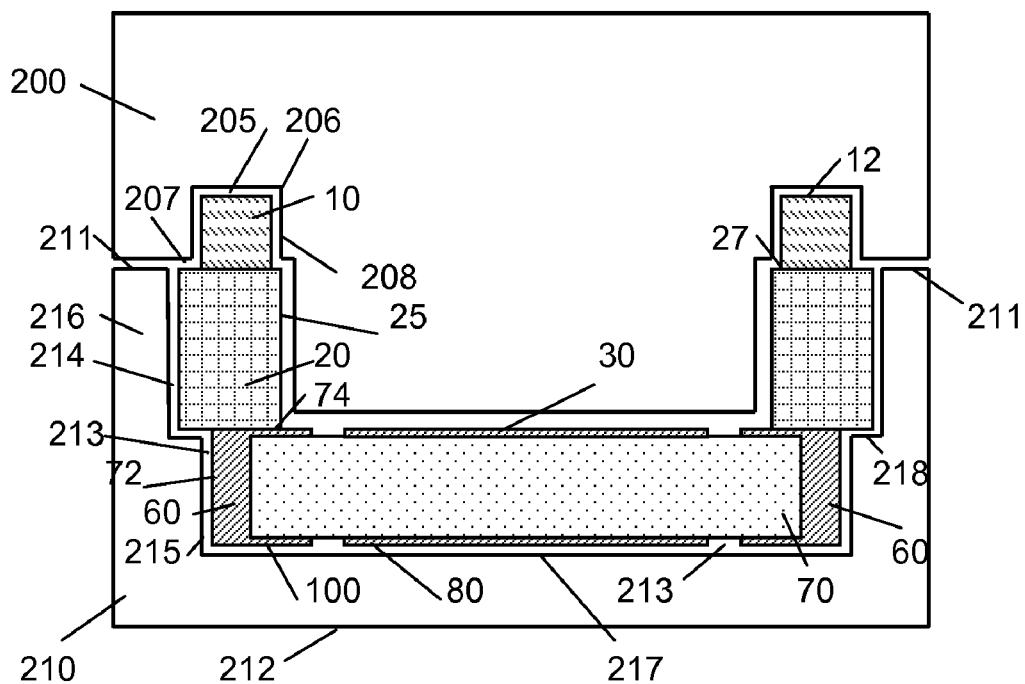
FIG. 5 is a cross-sectional view of the package within an exemplary embodiment of a mold.
Figure 6:
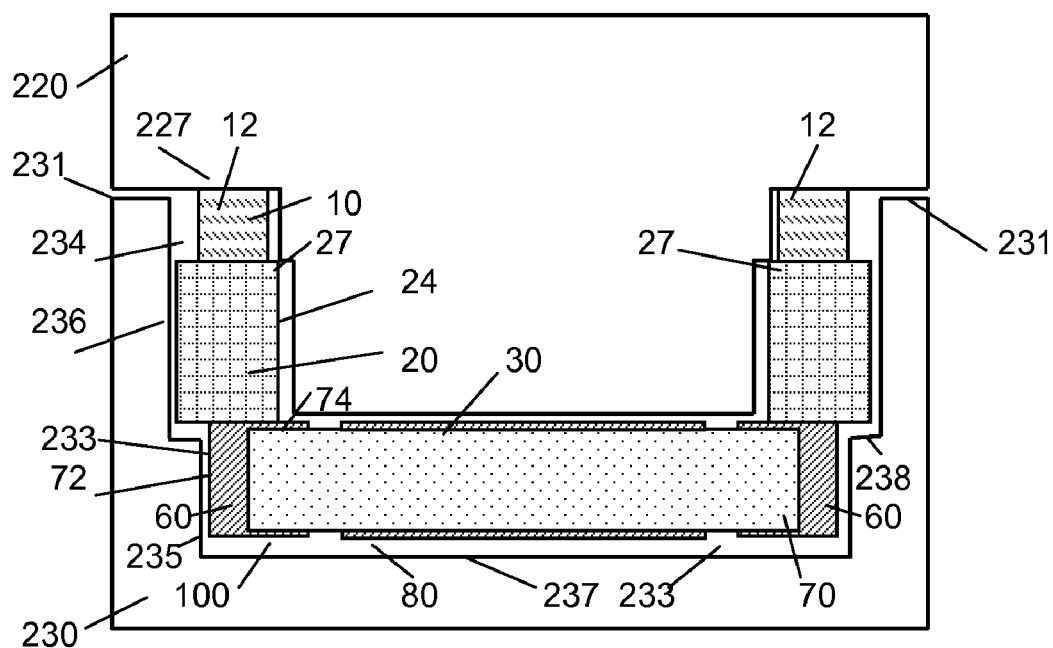
FIG. 6 is a cross-sectional view of the package within an alternate mold embodiment.

Possible mold configurations to form the package are illustrated in FIGS. 5 and 6. The mold may be formed from carbon, aluminum, steel, silicon carbide, or any other suitable material. The mold may include resistive coils (not shown) for electrically heating the mold, but typically the mold will be configured for placement in a firing furnace for a specified period of time. The mold assembly includes an upper mold 200 part and a lower mold 210 part which may be pinned together or the outer edges overlap each other for alignment purposes. The mold may also have external clamps to hold the upper mold 200 in place against the lower mold 210. The clamps may also be used to apply pressure to the stack (ceramic base 70, the preform 20, and the seal ring 10).

The lower mold 210 has a first recess 213 defined by first sidewalls 215 and interior bottom 217 and is of sufficient depth to fully receive the ceramic base 70. The first recess 213 has the same shape as the ceramic base 70 but is slightly larger along the x-y plane so that the ceramic base 70 fits loosely within it. The height of sidewalls 215 terminate at a step 218 at which point a second recess 214 is defined by sidewalls 216, with larger x-y dimensions than the first recess 213. Step 218 will be generally be on the same vertical level as the upper surface 74 of base 70. The second recess 214 extends vertically between top surface 211 and step 218 and corresponds to the vertical dimension of preform 20.

To create the molded ceramic package, the seal ring 10, glass preform 20, and ceramic base 70 are assembled using a glass melting/sealing process. The ceramic base 70 is placed into the lower mold 210 within the first recess 213. The package attachment pad 80 faces downward and rests on the upper surface 217 while the chip attachment pad 30 faces upward. The outer edge 72 fits loosely within the recess 213 and presses lightly against the first sidewall 215. The fit is loose enough so that if the mold is turned over, the ceramic base will fall out with a slight taping of the mold. But the ceramic base 70 will not move appreciably within the first recess 213.

Preform 20 is placed into the mold 210 within the second recess 214 so that it sits directly on the upper surface 74 of ceramic base 70. The preform 20 need not contact with step 218 but may contact the second sidewalls 216 to align the preform 20 with base 70.

Seal ring 10 is positioned onto the top surface 27 of the preform 20. Upper mold 200 is placed on top of the stack with its lower edge 207 abutting the upper edge 211 of lower mold 210. The center portion of upper mold 200 extends downward to center the mold within the preform. Seal ring 10 is centered by a third recess 205 within the upper mold 200 and, thus, is centered relative to the preform 20. Surface 206 of the third recess 205 sits directly on top of seal ring 10 to apply a downward pressure to compress the sandwich formed by the seal ring, the preform 20 and the ceramic base 70. If additional pressure is desired, external clamps (not shown) may be used to apply compression to the mold halves. If no pressure is desired, the depth of the third recess 205 may be increased to be greater than the thickness of seal ring 10.

In a first alternate embodiment illustrated in FIG. 6, the second recess 234 is deeper than in the embodiment of FIG. 5, so that it corresponds to the combined thicknesses of the preform and the seal ring. The top surface 231 would then be level with or slightly below the top of the seal ring 10. The upper mold 220 may be used to keep the seal ring 10 in alignment and apply pressure to the stack, or it may be eliminated altogether.

In the embodiment of FIG. 6, lower mold 230 has a first recess 233 which is dimensioned to receive the base 70. The ceramic base 70 is placed into the first recess 233 to sit on inner surface 237. The step 238 may be level with the upper surface 74 of ceramic base 70, or it may be slightly lower to allow the preform 20 to sit directly on the upper surface 74 of ceramic base 70.

Lower mold 230 has a second recess 234 which has a slightly larger inner dimensions relative to the first recess 233 to accommodate the larger outer dimensions of the preform. Preform 20 is placed into the second recess 234 and sits on the upper surface 74 of ceramic base 70 and/or the step 238. The preform 20 may be in contact with the second sidewalls 236 of the second recess 234. Seal ring 10 is placed into the second recess 234 on the top surface 27 of preform 20.

Once the stack is formed, the upper mold 220 is placed onto the lower mold 230 with its center portion centered within preform 20. The upper surface 227 will rest on the upper surface 12 of the seal ring 10. The lower edge 227 may or may not abut the top edge 231 of the lower mold 230 depending on the amount of downward force on the stack that is desired.

The mold halves, with the stack inside, are placed into a furnace and is heated using process conditions appropriate for the materials used. During heating, the preform 20 flows sufficiently to conform itself to the topography of the base, including the conductive patterns. The heating process causes the preform 20 to fuse to the seal ring 10 and ceramic base 70 creating a hermetically sealed cavity between the base and seal ring. (Of course, the package itself will not be fully hermetic until the lid is attached.) After the heating process, the package is cooled in a manner appropriate for the materials used.

Figure 7:
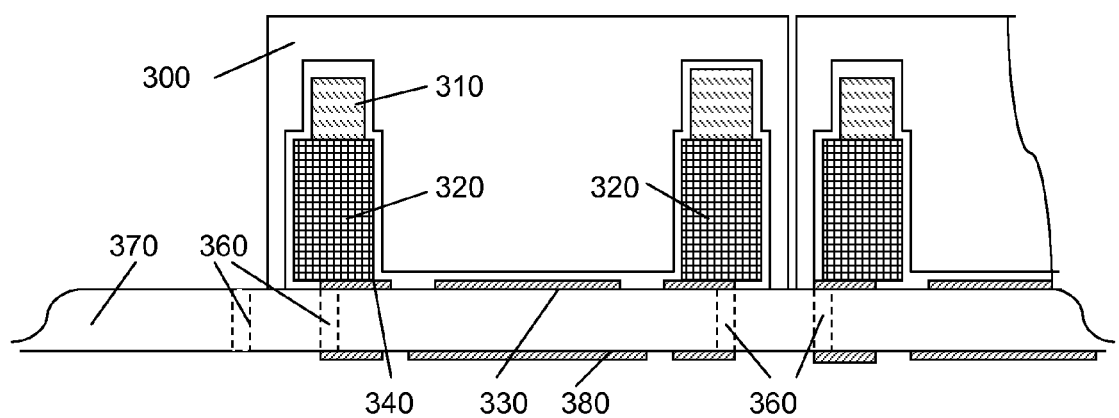
FIG. 7 is a cross-sectional view of another mold embodiment for use with an array.

In another embodiment, illustrated in FIG. 7, a single piece mold 300 is used for placement on a ceramic array that will provide the bases of multiple individual packages that will be separated after processing is complete. In this configuration, multiple molds will be used. The array 370 is a flat section of post-fired ceramic. Holes for formation of vias 360 are laser cut into the blank, and conductive patterns 330, 340, 380 are formed on the upper and lower surfaces of the array to define the base components. The preforms 320 are aligned with the pattern on the array 370 and the seal rings 310 are aligned with the preforms. A single mold 330 can be provided for forming each package, or an array of molds can be formed. The molds are aligned with the outline of the base, which may be facilitated by the use of pins or some other alignment device on the array, then the entire assembly is fired. After the array has been processed, the packages are separated by dicing the array.

After thermal processing, a MMIC or other microelectronic device(s) is placed in the package and soldered in place onto the chip attachment pad. The wire bonds are formed using conventional attachment procedures and the metal lid is attached to the seal ring using solder reflow to create a hermetic seal. Alternative attachments methods are known in the industry and will be readily apparent to those in the art. In addition, the lid may be ceramic, plastic, composite, or other material as is appropriate for the type of devices to be packaged.

The following examples provide a number of different variations in the inventive process for fabrication of the molded ceramic surface mount package:

EXAMPLE 1

A flat section of post-fired ceramic is laser cut with holes. The alumina ceramic is large enough to accommodate an array of parts. The holes are positioned to form the inputs and outputs of the package, and for features to align the ceramic array to the mold. In this embodiment, the ceramic is 96% alumina.

The inside surfaces of the holes for package input/output are coated with refractory metal paste. A pattern of refractory metal, in this case, tungsten paste, is screen printed onto the top and bottom of the ceramic base. The metal is fired onto the ceramic. Typical conditions for firing are 1300° to 1500° C. in a nitrogen atmosphere furnace. In addition to the nitrogen cover gas, hydrogen or water vapor may also be required, depending on the composition the binding agents added to the refractory metal used. Appropriate refractory metal pastes are commercially available and instructions for proper firing will generally be provided by the manufacturer. Depending on the size or width of the wall to be attached, a suitable glass frit may be printed over key areas of the metallization to aid adhesion.

The next step is to form the molded ceramic body on top of the array. A carbon mold is used for this step. The carbon mold may contain a single cavity or multiple cavities to form one to several package bodies, respectively, on the array.

The molded ceramic body is a glass with hard, fine ceramic aggregate filler. In this example, the glass is any of several commercial grades of glass that meet the performance requirements of the original Corning 7052 glass, which is an alkali barium borosilicate glass commonly used for sealing Kovar®. (Also available as Kimble EN-1 glass (Kimble/Kontes, Vineland, N.J.).) It has a relative dielectric constant $\in_R$ of 4.9, mass density of 2.27 g/cm$^3$, softening point of 712° C. and coefficient of thermal expansion of $47 \times 10^{-7}$/° C. While Corning no longer manufactures this glass, the formulation is an industry standard that is commercially available from many different sources. The glass is loaded with 5 to 25% finely dispersed alumina powder to help control the glass flow, and to improve crack resistance of the package.

In a typical construction, a metal seal ring is placed into the mold on top of the glass after which a glass preform is added on top of the seal ring. The metal ring must be an alloy suitable for sealing to the glass. In this example, the metal ring is an iron-nickel-cobalt alloy meeting the requirements of ASTM F-15, e.g., Kovar®.

The carbon mold or molds are arranged to line up with the array (base). Metal pins may optionally be used to obtain precise alignment of the mold(s).

The array is fired in a furnace to fuse the loaded glass into the carbon mold and to fuse it to the alumina array. Typical conditions are 875° to 975° C., as measured on the carbon fixture, for 9 to 15 minutes in a nitrogen furnace atmosphere. A trace of hydrogen and water vapor may be added to control the seal and wetting of the glass to the metal and the ceramic base. The trace amounts can be several atomic percent of one or both in the nitrogen.

After the glass is fused to the ceramic, the carbon mold(s) are removed. The array is cleaned to remove any carbon dust and residual metal oxides from the sealing process.

In the array form, parts can be plated as required. In this example, one preferred plating would be 0.0001 inches of either low stress electrolytic nickel or electroless nickel, followed by electroplated gold, or electroless gold plating.

The final step is to separate the parts in the array. There are several options for separation, including diamond saw, and scribing/breaking. Alternatively, the parts may be left in array form for delivery to customers who may prefer to insert the components while the devices are still in the array form.

EXAMPLE 2

For construction of the package base, an alternative fully fired ceramic that can be used in place of 96% Alumina is beryllium oxide (BeO), which provides better heat dissipation to form the package base. The thermal expansion of the ceramic may require other material changes to achieve a stable structure. The use of a BeO base will require the use of Kimble IN3 glass (Kimble/Kontes, Vineland, N.J.) or CV111 from Owens-Illinois, Inc. (Perrysburg, Ohio), or equivalent, for the preform, with an alumina or higher expansion inert ceramic filler. Appropriate processing steps will be specified by the preform manufacturer.

EXAMPLE 3

Another alternative to the use of a BeO base is fully-fired aluminum nitride (AlN), which provides better heat dissipation, better electrical properties, or may be advantageous to mitigate environmental and strategic material concerns associated with BeO.

For use of AlN, the preform can be formed using Morgan proprietary glass 365, available from Morgan Advanced Ceramics (Latrobe, Pa.), or equivalent with an alumina or higher expansion inert ceramic filler. The use of this alternate material may require a lower expansion seal ring, especially for larger packages. For smaller packages, Kovar® may be used, but larger designs may require the use of the Invar® or similar low expansion metal alloy.

EXAMPLE 4

The metal seal ring can be eliminated if the package is not required to meet hermetic seal military requirements. The base may be formed from either alumina oxide (Al$_2$O$_3$), BeO or AlN. In this variation, the molded ceramic wall serves as a shell to be filled with potting material to cover the device, or it may be used as a support to attach a suitable lid with a suitable adhesive. Lids and adhesives are well known in the industry.

EXAMPLE 5

The metal seal ring may be replaced with a ceramic seal ring in conjunction with a base of either Al$_2$O$_3$, BeO or AlN. This will produce a package that is stronger, and with a well defined shape of the top surface of the seal ring. As above alumina is be suitable to use as the seal for small packages, but for larger packages, the expansion of the ceramic will need to be adjusted to match or be close to that of the base.

EXAMPLE 6

Fabrication of packages suitable for magnetic and radiation hardened environments is commonly achieved by eliminating, or reducing as much as possible, the amount of high atomic weight materials in the package. If the ceramic seal rings of Example 5 are metallized on the top surface, a ceramic lid with a small amount of metallization can be soldered on to form a hermetic seal. The body of a package thus produced is predominately low atomic weight glass or ceramic, and, thus, there is relatively little higher atomic number metal material. The only metal material in the package is in the form of very thin metallization, plating, or a thin solder joint. By making the package a leadless design for direct surface mount, this further reduces the amount of high atomic number materials. The design is also useful for circuits that need to operate in high magnetic field environments, as there can be very little magnetic material used in the construction.

There are two technically feasible ways to make a package meeting the form, fit and function of the embodiments described above having an alumina base layer. The first way is by conventional HTCC (High Temperature Cofired Ceramic). One could also consider the LTCC (Low Temperature Cofired Ceramic). Due to start up cost and lead times, the process of the present invention for making a molded ceramic surface mount package (MCSMPC) is much more economical for smaller product volumes, e.g., custom designs, and packages where a short lead time is critical. The conventional methods for making most ceramic packages require precision machining of hard metal tooling, as well as the creation of the package and the tooling drawings. Under the inventive method, the drawings of the ceramic body become the digital template for CADCAM manufacture of the ceramic array. MCSMPC does require metal tooling to make the molded ceramic preform, but it is a relatively simple press mold, and there is an existing, commercially-available selection of tooling for making preforms for making the upper part of all glass body leaded packages.

For some applications, one could achieve the same form, fit, and function by employing either the inventive method for creating a MCSMP or that disclosed in U.S. Pat. No. 6,639,305 for forming a SLSMP. However, the inventive MCSMP method can achieve a smaller total footprint, and finer input/output pitch. The inventive method is capable of producing packages as small as 4 mm square (0.160"), with 16 input/outputs (including one for the internal ground) and packages 3 mm square with 12 input/outputs (including one for the internal ground). It should be understood that the packages need not be square, but the dimensions presented are to list the smaller dimension if the package is to be rectangular.

The SLSMP requires the use of a lead frame, and the step of molding material around the lead frame. The lead frame can be produced in an array, but due to the length of the leads, the array is relatively large to make, for example, a 6 cell by 6 cell array of packages. This introduces considerations of thermal expansion matches in the leads, dielectric, and the molds Therefore, the more straightforward approach to fabricate the SLSMP package is to use a single lead frame, and assemble them one at a time. The absence of a lead frame in the present design allows each package cell in an array to be spaced relatively closer for a given size package, allowing more efficient use of material and labor with higher volume production.

Ceramic forms the bottom of the MCSMP package. The most likely base in the SLSMP package is iron/nickel/cobalt alloy. While this seals well to the dielectric, it has poor thermal conductivity. The most likely base for the MCSMP package is 96% alumina, which has 2× the thermal conductivity of the metal alloy. The design can be used with ceramics with very high thermal conductivity for most efficient thermal performance.

It will be recognized by those in the art that the inventive process described above is not limited to QFP-type or surface mount packages, but may be utilized for fabrication of other types of microelectronic packages with other types of materials, including ceramic or metal, where reduced cost is desired while maintaining electrical performance and reliability.

The foregoing description of preferred embodiments is not intended to be limited to specific details disclosed herein. Rather, the present invention extends to all functionally equivalent structures, methods and uses as may fall within the scope of the appended claims.

The invention claimed is:

1. A method for fabricating a hermetically sealable surface mount package, comprising:

forming conductive patterns on a ceramic base, the conductive patterns comprising wire bond pads, input/output connections, a ground connection and at least one attachment pad for attachment of one or more microelectronic devices within the package;

disposing a dielectric preform on an upper surface of the base, the preform having a thickness that is greater than a height of the one or more microelectronic devices, wherein the preform abuts portions of the wire bond pads and the input/output connections;

disposing a seal ring on top of the preform;

disposing a mold over the preform and seal ring to align the preform and seal ring with the base;

firing the mold with the base, preform and seal ring under predetermined conditions to form a fused base, dielectric and seal ring, wherein the mold defines outer and inner dimensions of the dielectric; and removing the mold;

wherein the dielectric defines a cavity within which the one or more microelectronic devices is retained.

2. The method of claim 1, wherein the preform comprises a ceramic filled glass.

3. The method of claim 1, wherein, prior to forming conductive patterns, holes are formed through the base and wherein the step of forming conductive patterns includes plating the holes with a conductor to define the input/output connections.

4. The method of claim 1, wherein the base is one of a plurality of bases defined within a ceramic array, and further comprising the step of separating the plurality of bases after removing the mold.

5. The method of claim 4, further comprising, before or after separating the plurality of bases, plating the conductive patterns.

6. The method of claim 5, wherein plating comprises applying a nickel plate followed by a gold plate.

7. The method of claim 1, wherein the ceramic base is formed from alumina.

8. The method of claim 1, wherein the seal ring is metal.

9. The method of claim 1, wherein the seal ring is ceramic.

10. A method for fabricating a surface mount package, comprising:

providing a ceramic base having an upper surface;

forming conductive patterns on the upper surface;

contacting a dielectric preform on the upper surface, the preform defining a cavity over a center of the base, wherein the preform contacts a portion of the conductive patterns to define at least one internal-to-external connection;

applying a mold around the preform, wherein the mold defines the inner and outer edges of a dielectric ring;

firing the base and preform with the mold to fuse the base and preform; and removing the mold.

11. The method of claim 10, wherein the step of providing a base includes forming through-holes near outer edges of the base.

12. The method of claim 11, wherein the step of forming conductive patterns includes plating the through-holes with a conductive material to form vias that are in electrical contact with the conductive patterns.

13. The method of claim 10, further comprising, prior to applying a mold around the preform, disposing a seal ring on top of the preform so that the mold is applied around the preform and the seal ring and the step of firing fuses the base, the preform and the seal ring.

14. The method of claim 10, wherein the base is one of a plurality of bases defined within a ceramic array, and further comprising the step of separating the plurality of bases after removing the mold.

15. The method of claim 14, further comprising, before or after separating the plurality of bases, plating the conductive patterns with a finish plating.

16. The method of claim 15, wherein the step of plating comprises applying a nickel plate followed by a gold plate.

17. The method of claim 10, wherein the mold is a two-piece mold wherein a lower half of the mold receives the base prior to contacting the preform on the upper surface.

18. A method for fabricating a surface mount package, comprising:

providing a lower mold, the lower mold having a recess corresponding to a desired outer dimension of the surface mount package;

disposing a base within the recess of the lower mold, the base having conductive patterns formed on an upper surface thereof;

disposing a dielectric preform on the upper surface of the base, wherein the preform contacts a portion of the conductive patterns to define at least one internal-to-external connection;

applying an upper mold over the preform, the base, and the lower mold, the upper mold defining an interior dimension of the surface mount package;

firing the base and preform within the mold to fuse the base and preform; and removing the upper and lower molds.

19. The method of claim 18, wherein the base has a plurality of through-holes formed near its outer edges and plated with a conductive material to form vias that are in electrical contact with the conductive patterns.

20. The method of claim 18, further comprising, prior to applying the upper half of the mold over the preform, disposing a seal ring on top of the preform so that the mold is applied over the preform and the seal ring and wherein the step of firing also fuses the base, the preform and the seal ring.

* * * * *